United States Patent [19]
Thomann

[11] Patent Number: 5,544,108
[45] Date of Patent: *Aug. 6, 1996

[54] CIRCUIT AND METHOD FOR DECREASING THE CELL MARGIN DURING A TEST MODE

[75] Inventor: Mark R. Thomann, Boise, Id.

[73] Assignee: Micron Technology, Inc., Boise, Id.

[ * ] Notice: The term of this patent shall not extend beyond the expiration date of Pat. No. 5,469,393.

[21] Appl. No.: 510,689

[22] Filed: Aug. 3, 1995

Related U.S. Application Data

[63] Continuation of Ser. No. 122,732, Sep. 15, 1993, Pat. No. 5,469,393.

[51] Int. Cl.⁶ .................................................. G11C 29/00
[52] U.S. Cl. ........................ 365/201; 365/190; 365/203
[58] Field of Search .................................. 365/201, 210, 365/190, 203, 207

[56] References Cited

U.S. PATENT DOCUMENTS

| | | | |
|---|---|---|---|
| 4,468,759 | 8/1984 | Kung et al. | 365/201 |
| 5,029,330 | 7/1991 | Kajigaya | 365/201 |
| 5,276,647 | 1/1994 | Matsui et al. | 365/201 |
| 5,339,273 | 8/1994 | Taguchi | 365/201 |
| 5,469,393 | 11/1995 | Thomann | 365/201 |

Primary Examiner—Tan T. Nguyen
Attorney, Agent, or Firm—Susan B. Collier

[57] ABSTRACT

The invention is a monolithic memory device having a circuit and a method for decreasing the cell margin during a test mode. Decreasing the cell margin stresses the memory device during the test mode greater than a stress experienced during normal operation, thus test time can be decreased.

29 Claims, 8 Drawing Sheets

CIRCUIT AND METHOD FOR DECREASING THE CELL MARGIN DURING A TEST MODE

This is a request for filing a continuation of application Ser. No. 08/122,732 filed on Sep. 15, 1993, now U.S. Pat. No. 5,469,393.

FIELD OF THE INVENTION

The invention relates to monolithic semiconductor memory devices, and more particularly to test circuitry on the monolithic memory device.

BACKGROUND OF THE INVENTION

Figure 1:
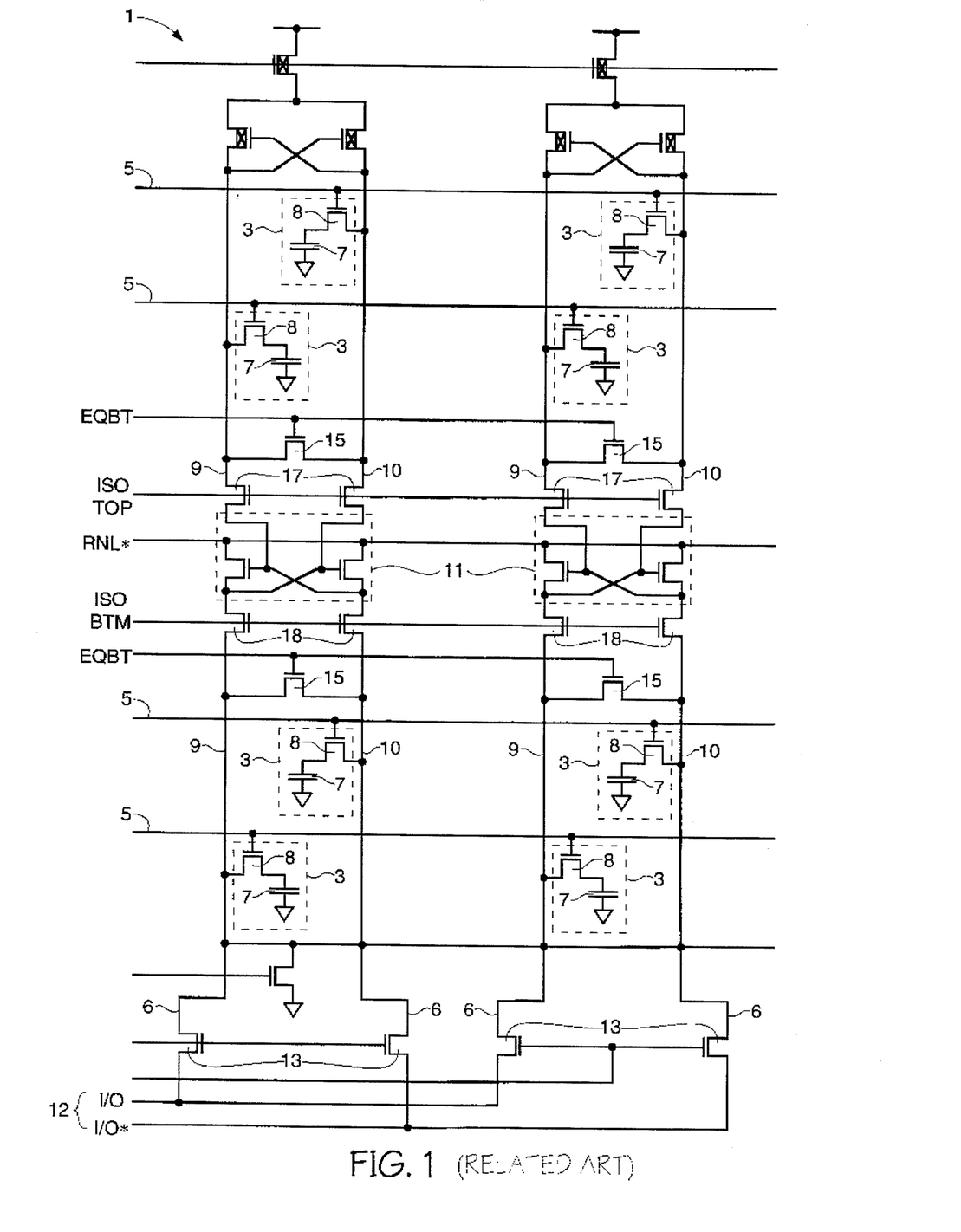
FIG. 1 is a schematic of a portion of a memory array of the related art.

FIG. 1 depicts a portion of a dynamic random access memory (DRAM) device 1 which stores digital information or data in an arrangement of memory cells 3. An arrangement of memory cells is known as an array. The cells 3 are arranged in the array in a configuration of intersecting rowlines 5 and column lines 6. The rowlines 5 may also be referred to as wordlines. Each memory cell 3 comprises a storage capacitor 7 capable of holding a charge and a metal-oxide semiconductor field effect transistor (MOSFET) for accessing the capacitor charge; hereinafter this transistor is referred to an as access transistor 8.

The charge is a voltage potential referred to as a data bit and is typified as having either a high voltage "1" or a low voltage "0". Therefore, the memory has two states, often thought of as the true logic state and the complementary logic state. The data bit is amplified and latched to the digit 9 and digit bar 10 lines by the N-sense amplifier 11. The digit line 9 and the digit bar line 10 form a digit line pair. The P-sense amplifier pulls one digit line of the digit line pair to a high potential, usually the supply potential, $V_{CC}$, while the N-sense amplifier pulls the remaining digit line to a ground potential.

There are two normal operations available in a DRAM memory, a bit of data may be stored in a specified cell in the write mode or a bit of data may be retrieved from a specified cell in the read mode. The data is either transferred from the digit line pair in electrical communication with the specified cell to Input/Output (I/O) lines 12 in the read mode or transferred from the I/O lines 12 to the digit line pair in the write mode. In either case, the data is transferred through MOSFETs used as switching devices and called decode transistors 13. For each bit of data stored, its true logic state is available at a first I/O line and it complementary logic state is available at a second I/O line, designated I/O*. For purposes of this discussion, I/O and I/O* are often referred to as just I/O lines 12. Each cell 3 is electrically referenced to one digit line 9 and the corresponding digit bar line 10 through the N-sense amplifiers 11.

In order to read from or write to a cell 3, the particular cell 3 in question must be selected or addressed. A particular cell 3 is selected when a row decoder (not shown) activates a rowline 5 and a column decoder (not shown) activates a column line 6. The electrical intersection of the activated rowline 5 and the activated column line 6 determines which cell 3 as has been selected.

For example, during a read mode when a cell 3 has been selected the access transistor 8 of the selected cell 3 actuates and couples the charge stored on the storage capacitor 7 of the cell 3 to its respective digit line. The charge stored in the storage capacitor 7 has a potential different than the potential of the digit line. This difference between the potential of the storage capacitor 7 and the potential of the digit line is the cell margin. The N-sense amplifier senses the cell margin and determines what data has been stored in the cell. Next the N-sense amplifier amplifies the potential of the digit line to reflect the value of the potential stored in the cell. Once amplified the digit line in electrical communication with the selected cell has a potential representing the data bit stored in the storage capacitor, and the remaining digit line of the digit line pair has a potential equal to the complement of the data bit stored in the storage capacitor of the selected cell.

Typically the DRAM is connected electrically between a supply potential, $V_{CC}$, and a ground reference potential. The supply potential has often been equal to 5 volts but in more recent circuit generations it is less than 5 volts, typically 3.3 volts. Between cycles of cell selection it is necessary to equilibrate the digit lines of each digit line pair to the same voltage, often $V_{CC}/2$ or $\frac{3}{5}V_{CC}$. This equilibration of the digit lines occurs during what is often referred to as the precharge cycle. An equilibrate transistor 15 in parallel with the N-sense amplifier 11 essentially shorts digit 9 and digit bar 10 together and holds them at the equilibrate potential during precharge. This equilibration is necessary so that the digit lines are ready to receive data.

During normal operation one set of the isolation (ISO) gates, either 17 or 18, is deactuated to isolate the digit line capacitance to the side of the N-sense amplifier in which the selected cell 3 is located. This deactuation of one set of the isolation gates reduces the stray capacitance of the digit 9 and digit bar 10 by half thereby increasing the signal to noise (S/N) ratio. The S/N is equal to the storage cell capacitance divided by the digit line capacitance. Increasing the S/N ratio increases the cell margin and makes the part more reliable. As the cell margin increases the N-sense amplifier senses the data with greater accuracy. A part becomes more reliable with a sense amplifier's ability to sense and latch data correctly with decreasing cell margins.

There exists a need to reduce test time thereby reducing costs associated with testing large memory devices. There also exists a need for a monolithic memory device having a test mode circuit and a method which screens out substandard devices that usually need long and complicated test patterns. Screening out sub-standard devices reduces test times and costs.

SUMMARY OF THE INVENTION

The invention is a monolithic memory device having a circuit and method for decreasing a required time that the part must perform a test mode operation. The circuit and method of the invention reduce test times by decreasing the cell margin. Decreasing the cell margin increases the stress on the circuit under test, since it is now required to perform under more adverse conditions than those required under normal operating conditions. A circuit which is stressed beyond the conditions of normal operation may be tested for a shorter period of time.

In a first embodiment of the invention both sets of isolation gates in communication with a digit line pair are actuated in response to a logic control signal generated in a logic control circuit during the test mode. Typically this is performed when a row line is accessed. Since digit line capacitance is increased during the actuation of both sets of isolation gates, the S/N ratio decreases and the part is stressed beyond what it typically experiences in normal operation.

In a further embodiment of the invention a logic control circuit generates a ROWTESTA signal. The monolithic memory device has a load fabricated to be in electrical communication with digit and digit bar. The memory device responds to the ROWTESTA signal and the load is coupled to the digit lines during test, thereby increasing digit line capacitance. Thus the S/N ratio is reduced and the device is stressed.

In a further embodiment of the invention a generator generates a cell plate CP control voltage different than the equilibrate potential of the digit lines. When the generator generates a CP control voltage higher than the equilibrate potential it is more difficult for the N-sense amplifier to sense a high, since the high cell margin is decreased. Similarly when the generator generates a CP control voltage lower than the equilibrate potential it is more difficult for the N-sense amplifier to sense a low, since the low cell margin is decreased. Again decreasing the cell margin stresses part.

The test mode circuit and method of the invention allow for more efficient gaurdband testing. This is due to the fact that the test circuit and test method of the invention stress the monolithic memory device much harder than the normal operation stresses the memory device. Thus the guardband and test times are reduced.

DETAILED DESCRIPTION OF THE INVENTION

Figure 2:
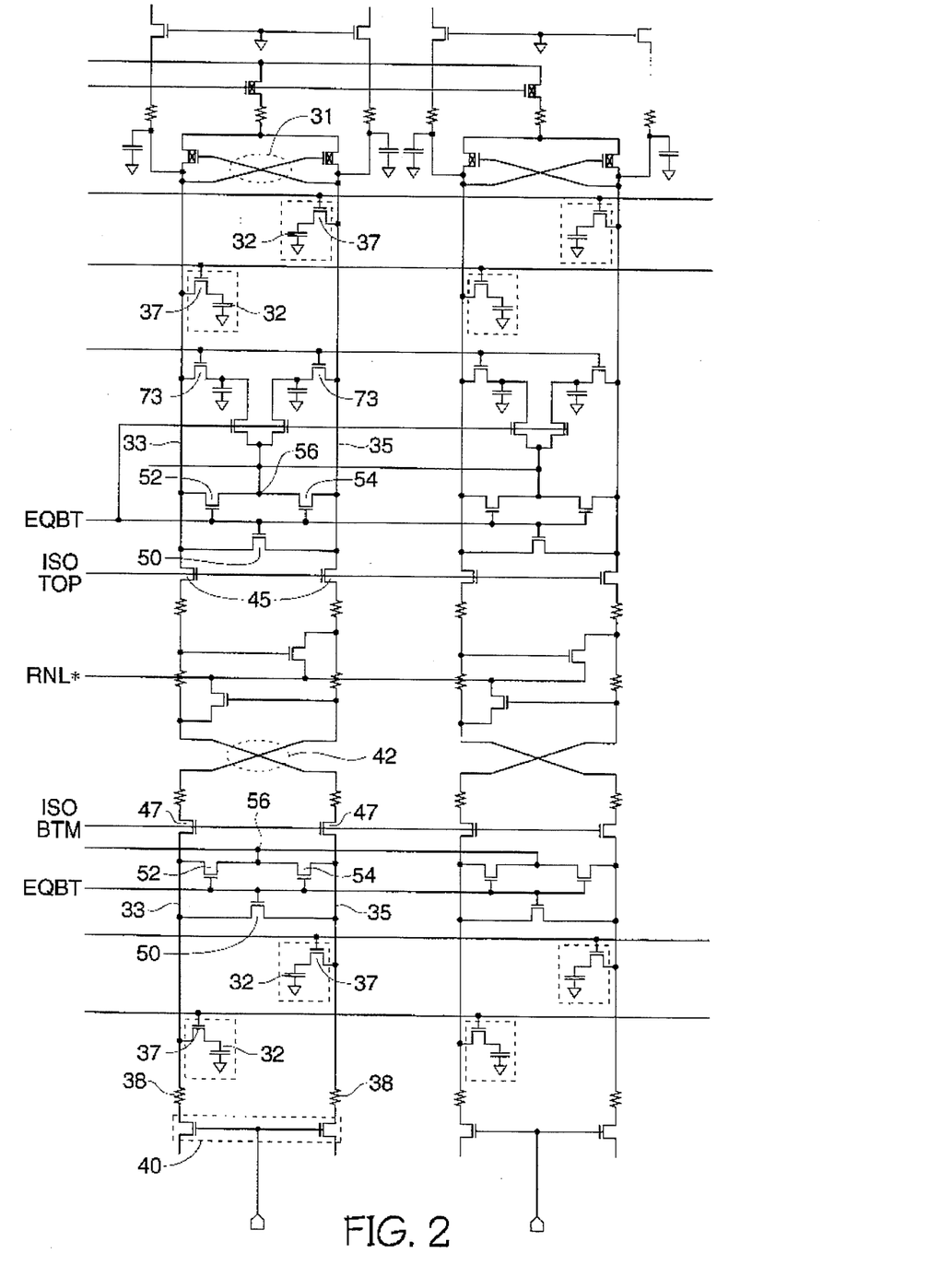
FIG. 2 is a schematic of a circuit depicting a preferred embodiment of the invention.

FIG. 2 is a detailed schematic of a portion of a monolithic memory device 18 of an embodiment of the invention. The circuitry of FIG. 2 reduces the cell margin during the test mode. The cell margin is the difference between the potential of the storage capacitor under test and the digit lines. This reduction in the cell margin stresses the memory device thereby reducing testing time. The circuit of FIG. 2 responds, in addition to an equilibrate (EQBT) signal, to the following signals during test, ROWTESTA, ISOTOP, and ISOBOTTOM, which are generated in logic control circuit 19.

Although the circuit of FIG. 2 is one embodiment of the invention it incorporates 3 separate embodiments. The invention may actually be any combination of the separate embodiments.

In order to simplify the discussion and provide a better understanding of the invention, the separate embodiments are shown in block schematic form in FIGS. 3, 4, 5 and 6. Each of the FIGS. 3, 4, 5, and 6 incorporates a portion of the circuit of FIG. 2. During the discussion of FIGS. 3, 4, 5, and 6 the circuit components are numbered. Components of FIG. 2 have been numbered the same as identical components of FIGS. 3, 4, 5, and 6.

Figure 5:
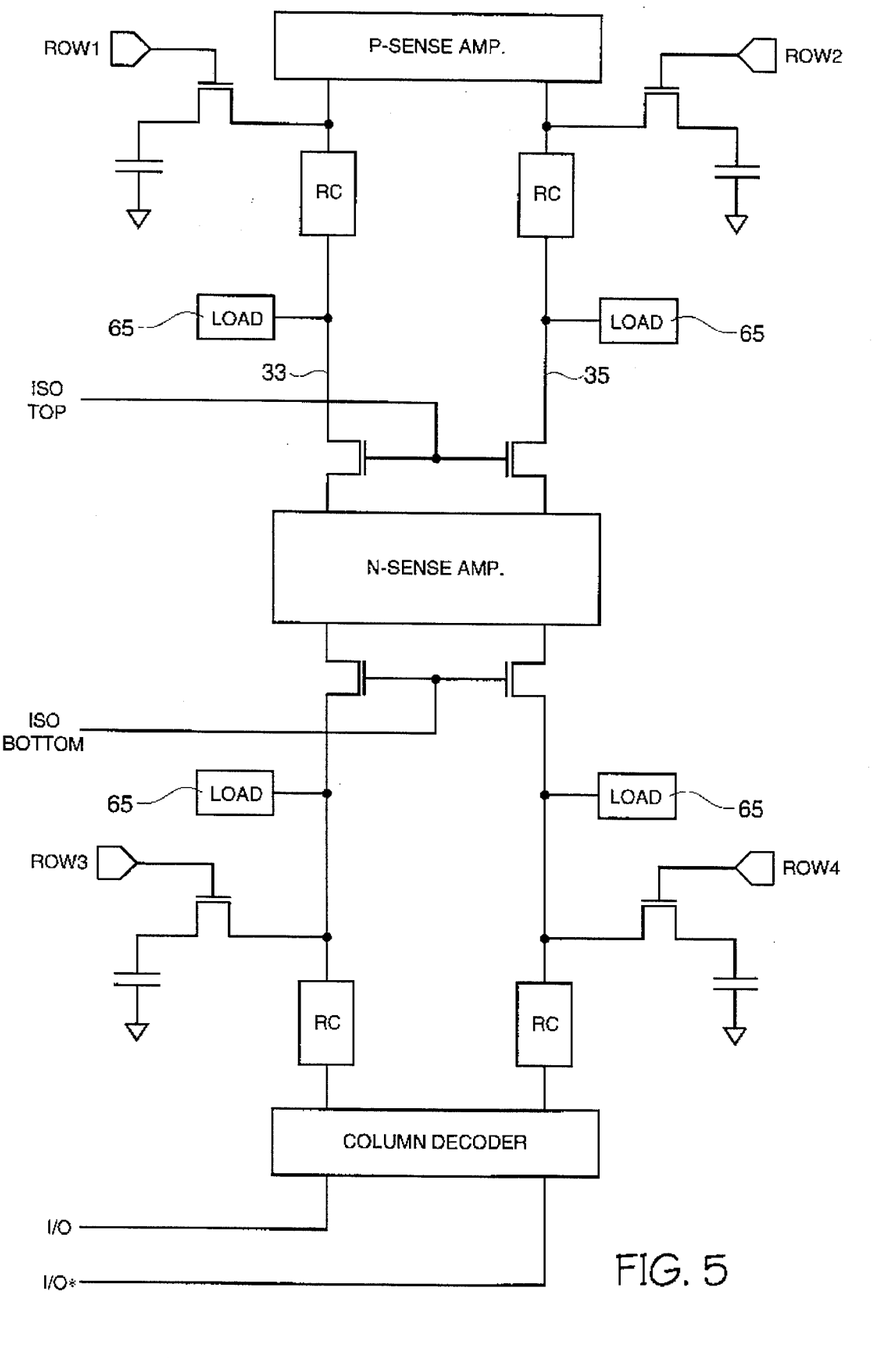
FIG. 5 is a block diagram of portions of FIG. 2.
Figure 6:
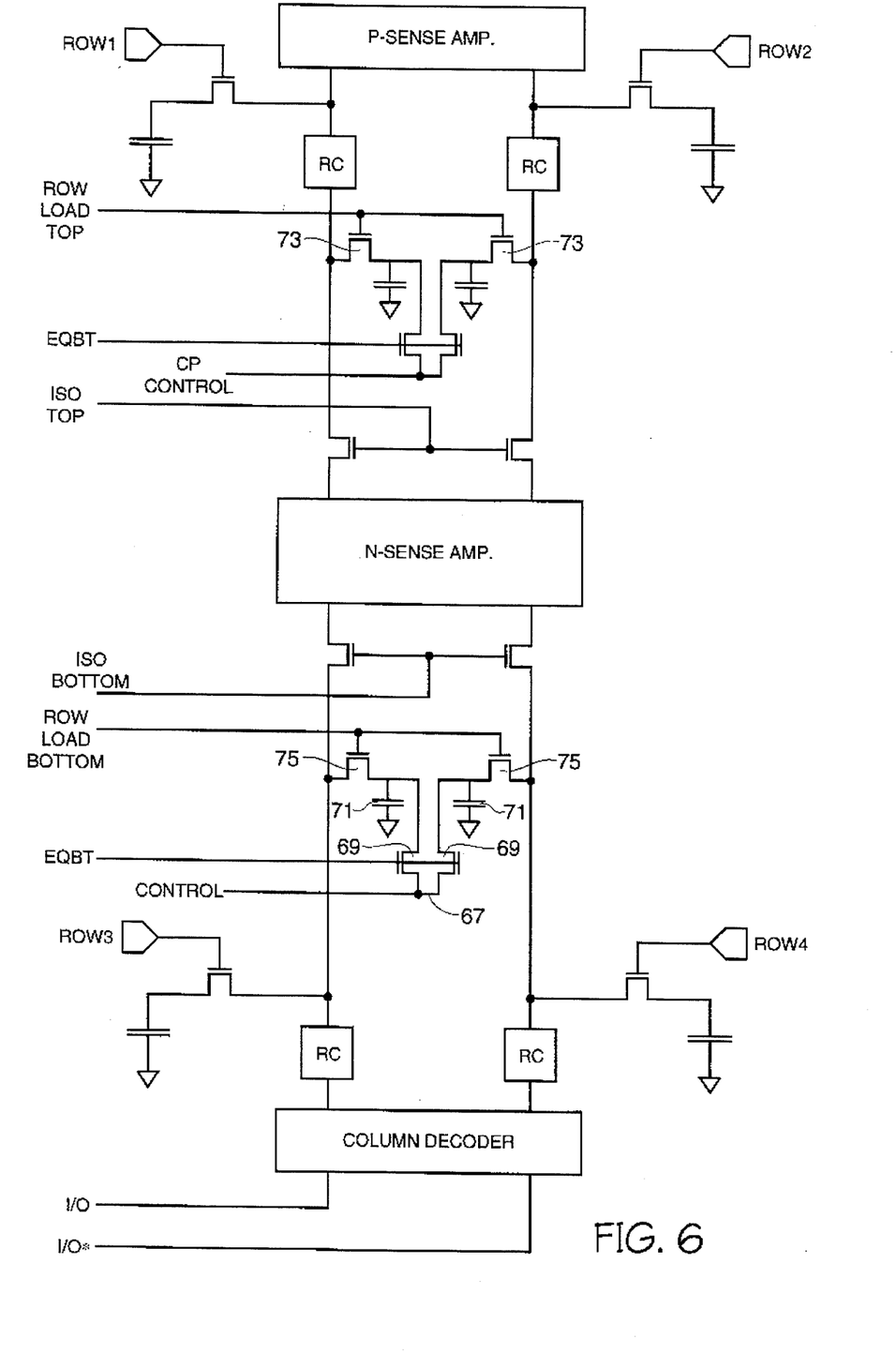
FIG. 6 is a more detailed schematic of the circuit of FIG. 5.
Figure 7:
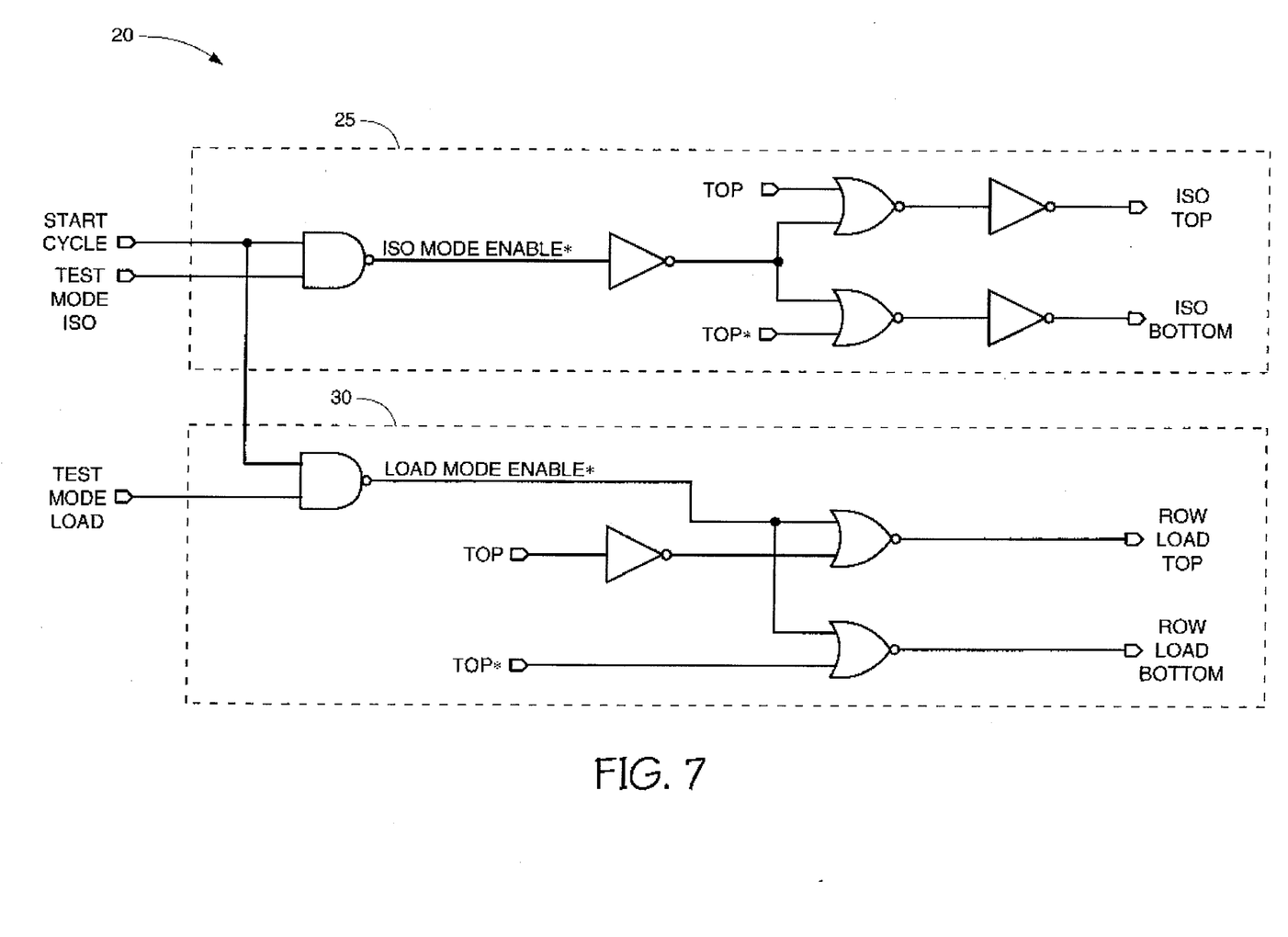
FIG. 7 is a schematic of a logic control circuit of the invention.

The logic control circuit 20 shown in FIG. 7 provides input signals to the circuits of FIGS. 3, 4, 5, and 6. Logic control circuit 20 has two independent circuit sections 25 and 30, and, depending on the embodiment, one or both or neither of the sections may provide input signals to the circuit of the invention. Circuit section 25 is used to allow the isolation gates to be actuated at the same time when the start cycle input signal and the test mode isolation input signal are active, in this case high. Circuit section 30 is used to generate signals which access an additional load when the start cycle input signal and the test mode load signal are active, in this case high.

Figure 3:
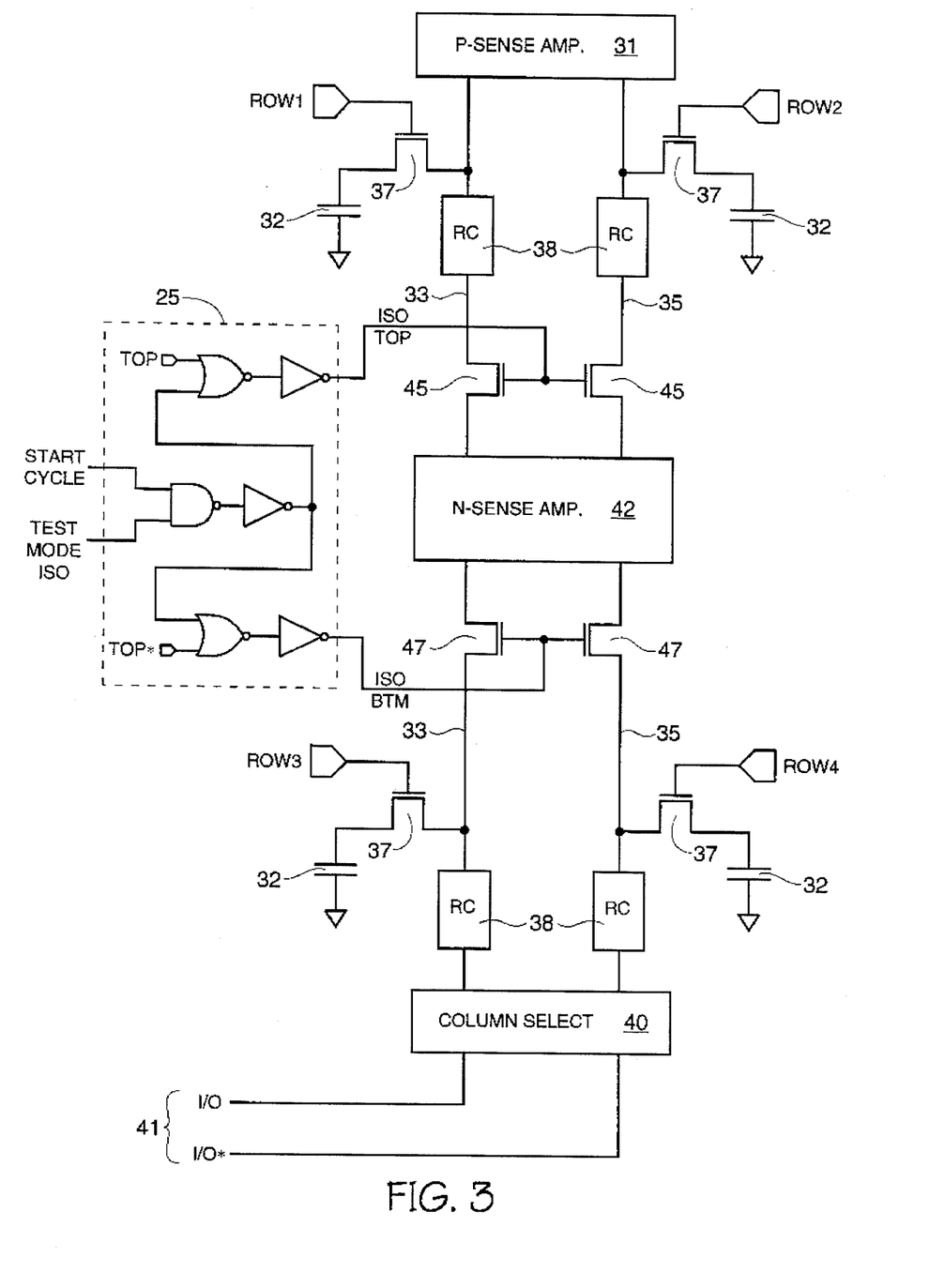
FIG. 3 is a block diagram of portions of FIG. 2.

FIG. 3 is block schematic representing a portion of the circuit shown in FIG. 2 and representing one embodiment of the invention. The circuit of FIG. 3 shows the P-sense amplifier 31 as a functional block. Each storage capacitor 32 represents the many storage capacitors in electrical communication with the digit line 33 and digit bar 35. There is one access transistor 37 for each storage capacitor 32, and the digit line capacitance of each digit line section is represented by the RC block 38. A column select circuit 40 is used to select the desired digit line and I\O lines 41 accept the data.

The N-sense amplifier 42 is electrically interposed in digit line 33 and in digit bar 35. Isolation gates 45, connected at their gates, are electrically interposed between an upper portion of digit line 33 and N-sense amplifier 42 and between an upper portion of digit bar 35 and N-sense amplifier 42. When actuated by the ISOTOP signal, generated in circuit section 25 of logic control circuit 20, isolation gates 45 provide electrical communication between the upper portion of digit 33 and the upper portion of digit bar 35 to the N-sense amplifier 42, and when deactuated by ISOTOP the upper isolation gates 45 isolate the upper portions of digit 33 and digit bar 35 from the N-sense amplifier 42. Lower isolation gates 47 react similarly with respect to the lower portion of digit line 33 and digit bar 35 in response to the ISOBOTTOM signal, also generated in circuit section 25 of logic control circuit 20, at their common gate connection.

In order to isolate digit line capacitance during a normal operation either the upper isolation gates 45 or the lower isolation gates 47 are deactuated when a row line is being accessed. This reduces the digit line capacitance by half of what it would be if both sets of isolation gates were activated. Decreasing the digit line capacitance increases the signal to noise (S/N) ratio. S/N is equal to the storage cell capacitance divided by the digit line capacitance. Reducing the digit line capacitance by half allows the N-sense amplifier to reliably sense and latch the data to the digit lines. This is due to the fact that the cell margin increases as S/N increases.

During normal operation one of the sets of isolation gates 45 and 47 is deactuated and the other is actuated in response to ISOTOP and ISOBOTTOM having opposite logic levels as generated by circuit section 25 of logic control circuit 20. In contrast, circuit section 25 generates an active ISOTOP and an active ISOBOTTOM during the test mode, and both sets of isolation gates 45 and 47 are actuated. The actuation of both sets of isolation gates 45 and 47 during rowline activation in the test mode reduces the S/N ratio since the digit line capacitance is effectively doubled over the effective digit line capacitance occurring during normal operation. Reducing the S/N ratio stresses the part by decreasing the cell margins. Since the part is stressed the test time is reduced.

Figure 4:
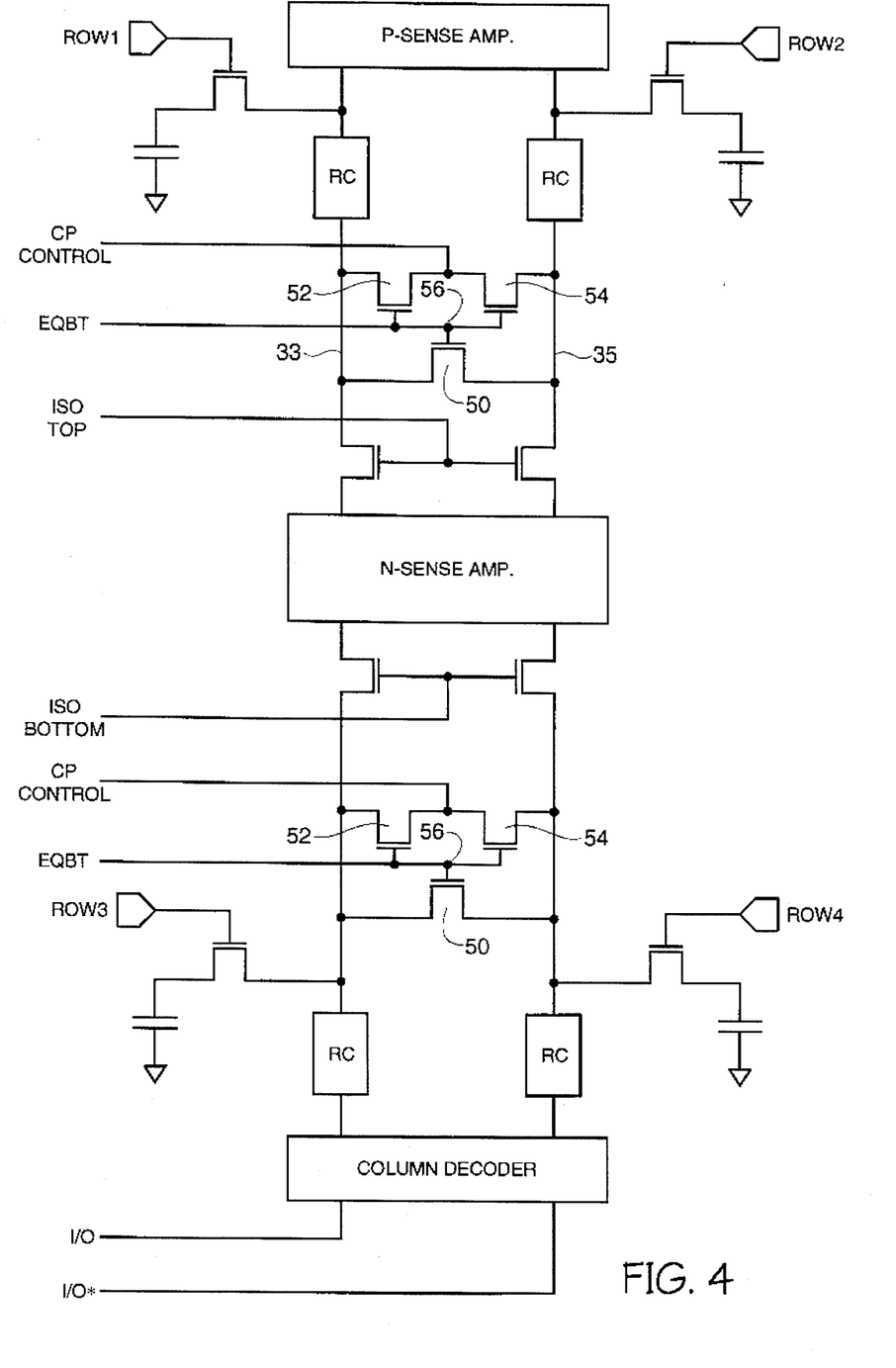
FIG. 4 is a block diagram of portions of FIG. 2.

A further embodiment of the invention is shown in FIG. 4. The components of the circuit of FIG. 4 have been numbered to correspond to equivalent components of the circuit of FIG. 3. The equilibrate potential is modified by the circuit of FIG. 4 to be either greater than or less than the equilibrate potential available during the precharge of a normal operation. In addition to the equilibrate transistor 50 each digit line pair is in electrical communication with two serially connected secondary equilibrate transistors 52 and 54 configured in parallel with equilibrate transistor 50. Secondary equilibrate transistors 52 and 54 are connected at a serial node 56. The secondary equilibrate transistors 52 and 54 are activated by an equilibrate (EQBT) signal that also controls the activation of the equilibrate transistor 50. The potential of serial node 56 is influenced by a cell plate (CP) control signal generated by a cell plate generator. The CP control signal is communicated to the digit lines 33 and 35 through the serial node 56 when transistors 52 and 54 are activated.

Figure 8:
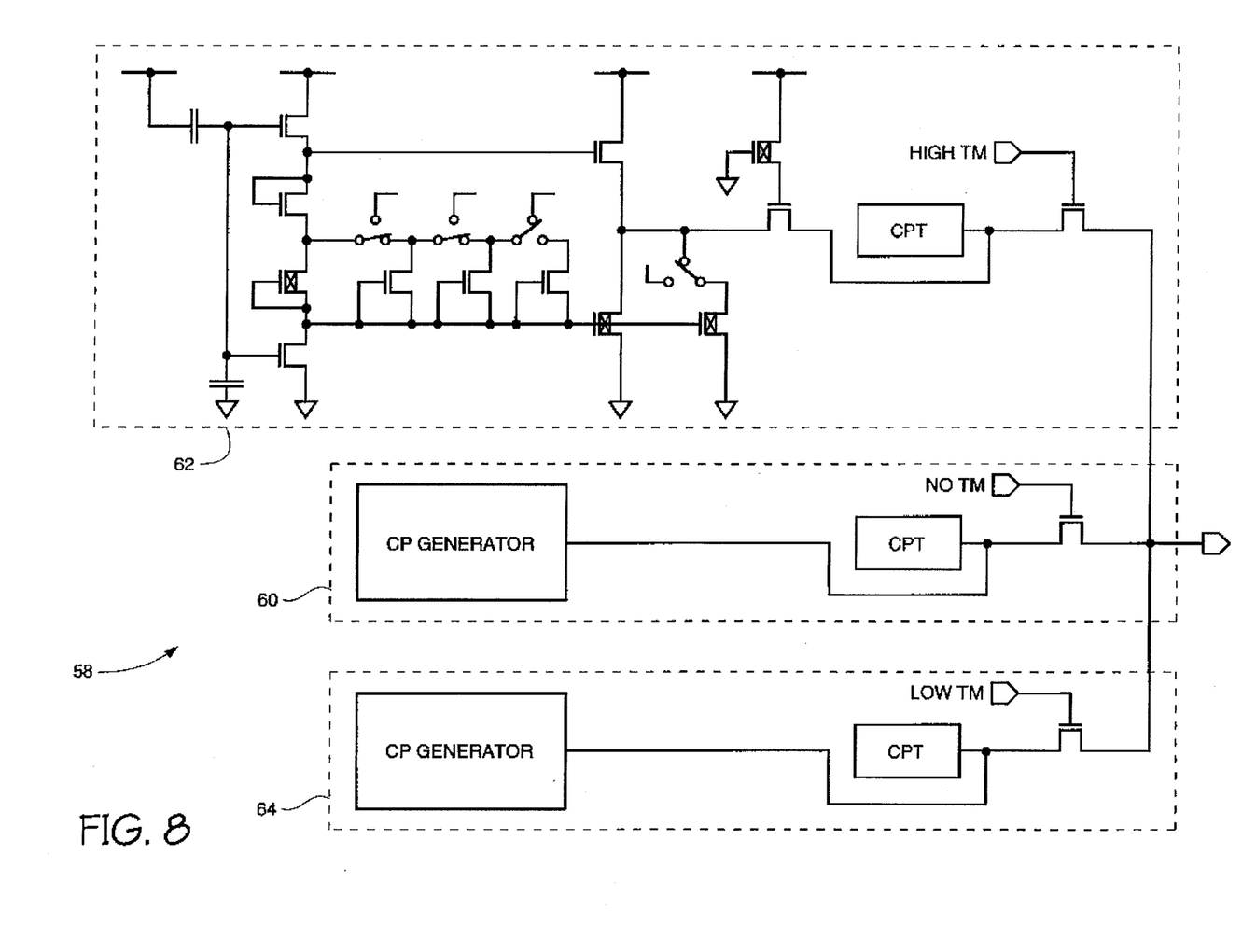
FIG. 8 is a schematic and block schematic representation of a cell plate generator of the invention.

The cell plate generator 58 shown in FIG. 8 generates the CP control signal. The CP control signal is equal to the typical equilibrate potential during normal operation and is generated in circuit portion 60 of the cell plate generator 58. The CP control signal is a potential either greater than or less than the typical equilibrate potential during the test mode, and is generated in circuit portion 62 and circuit portion 64 respectively. If a high logic level is stored in the cell under test the potential generated in circuit portion 62 is the cell plate potential, and if a low logic level is stored in the cell under test the potential generated in circuit portion 64 is the cell plate potential. Although portions 60 and 64 have been shown as a block diagram, circuit portion 62 is shown schematically. Portions 60 and 64 may be configured similar to the circuit portion 62. Variations required to generate the desired potentials are well known to those skilled in the art as are other circuit configurations for performing the function of circuit portion 62.

Referring again to FIG. 4, when the EQBT signal is high transistors 50, 52 and 54 are actuated shorting digit 33 and digit bar 35 together. Serial node 56 is connected to the output of the CP generator circuit 58 shown in FIG. 8. Therefore the CP control signal is felt at the serial node 56. If the potential of the CP control signal is greater than the equilibrate potential the equilibrate potential is forced higher, and if the CP control signal is less than the equilibrate potential the equilibrate potential is forced lower. By altering the equilibrate potential to a value closer to the potential of the data stored in the storage capacitor under test, the cell margin is reduced. Therefore, the part is stressed, and test time is reduced.

It should be noted that the actuation during the test mode of both sets of isolation gates 45 and 47 as shown in FIG. 3 is optional in the circuit of FIG. 4. Indeed they may both be actuated during the test mode to further decrease the cell margin, or only the isolation gates in the section of the digit lines having an active row need to be actuated.

Referring now to a further embodiment of the invention shown in FIG. 5, an additional load (a dummy load 65) is added to digit line 33 and digit line 35 to reduce the S/N ratio. The components of the circuit of FIG. 5 have been numbered to correspond to equivalent components of the circuit of FIG. 3. The dummy load 65 may look like another storage cell, but requires an addressing means to access a storage capacitor portion of the cell only during test. The dummy load is easily fabricated and requires relatively little silicon. In a case where both sets of the isolation gates 45 and 47 are actuated during test, it would only be necessary to have one dummy load 65 per digit line 33 and per digit bar 35. On the other hand if each section of the digit line has a load only the isolation gates corresponding to the section of the digit line having the cell under test need be actuated.

In a further embodiment, shown in FIG. 6, the dummy load may be a capacitor that has been charged to an electrical potential. The components of the circuit of FIG. 6 have been numbered to correspond to equivalent components of the circuit of FIG. 3. In the circuit of FIG. 6, a node 67 is connected to a desired potential available at the output of the generator 58, shown in FIG. 8. The actual potential generator used is not critical and other potential generators may be used. When the EQBT signal goes high the transistors 69 actuate and the capacitors 71 are charged toward the potential of node 67. Node 67 may be connected to a supply potential, $V_{CC}$, a ground potential, or a cell plate (CP) potential or a potential applied to the node by a logic control circuit programmed to decide between the three states. circuit section 30 of logic control circuit 20, as shown in FIG. 7, provides a ROW LOAD TOP and a ROW LOAD BOTTOM signal to actuate transistors 73 and 75 respectively. When either or both sets of transistors actuate the digit line capacitance increases due to the charged capacitors 71, cell margin is decreased and test time is decreased. As in the other embodiments only the isolation gates in the portion of the digit lines under test need be actuated in the circuit of FIG. 6. However, both sets of isolation gates 45 and 47 may be actuated during the test mode thereby reducing the cell margin even further.

By comparing the circuit of FIG. 6 to the circuit of FIG. 2 it can be seen that there are differences between the two circuits. In FIG. 2 there is only one set of loads, in this case in the upper portion of the digit line pair. It follows from the fact that there is only one set that the isolation gates are both actuated during the test mode of the circuit shown in FIG. 2. This is not necessarily the case for the circuits of FIGS. 5 and 6. The load relevant to the section of the digit line under test need only be the load accessed in the circuits of either FIGS. 5 or 6.

Dummy load capacitors are easily fabricated since they require relatively little silicon.

In addition, the node 67 of FIG. 6 is the serial node 56 of FIG. 4 and of FIG. 2. Therefore it can be seen that the circuit of FIG. 2 incorporates all of the circuits of FIGS. 3, 4, 5, and 6. Thus, it can be seen that various embodiments of the invention may be used independently or in various combinations. It is only important that the cell margin be decreased in order to decrease test time.

It has been shown that the invention provides a cell margin during test which is smaller than the cell margin under normal operating conditions. This smaller cell margin stresses the monolithic memory device and test times can be reduced which is a cost saving as well as a time saving feature.

For example, a sample memory device having none of the features of the present invention was tested to a 45 msec refresh limit so that the part would guarantee 8 msec under all possible test conditions. By using the test mode of the invention as shown in FIG. 3 the refresh limit was only 20 msec or even less while still guarantying the same margins.

The DQ test modes cannot effectively screen for all possible non-test-mode operations and usually require the part to be tested out of the DQ mode. However, with the test mode of the invention it is possible to test the part completely in the DQ mode. In a typical DQ test mode write/read operations are performed internally to multiples of 4, 8, or 16 at one time. Using the applicant's invention, along with the DQ-test mode, allows complete testing of the part. It should be noted that DQ test modes are well known to those skilled in the art.

The invention uses various materials which are electrically either conductive, insulating, or semiconducting, although the completed semiconductor circuit device itself is usually referred to as a "semiconductor." The invention refers to a method of testing addressed devices, but it is not restricted to implementations which involve memory devices or semiconductor devices.

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" or "in electrical communication" are therefore intended to include components which are in electrical communication despite intervening components.

Although the invention has been described in terms of a monolithic memory device, the circuit and method have utility in other circuits where a test mode time is reduced due to additional stress incorporated into the test circuitry. Accordingly the invention should be read as limited only by the claims.

What is claimed is:

1. A monolithic memory device, comprising:
   a) a storage cell configured to store electrical data;
   b) a digit line, having first and second sections, said digit line in selective electrical communication with said storage cell;
   c) a first test load in selective electrical communication with said first section; and
   d) a second test load in selective electrical communication with said second section.

2. The memory device as specified are in claim 1, a means for coupling said first and said second test loads to said digit line only during said test mode.

3. The memory device as specified in claim 2, wherein said first and said second test loads increase a total load on said digit line without interrupting a current flow in said digit line when coupled to said digit line.

4. The memory device as specified in claim 2, wherein said first and said second test loads decrease a difference in potential between said storage cell and said digit line during said test mode from a difference in potential between said storage cell and said digit line during a normal operation mode.

5. The memory device as specified in claim 1, wherein each of said first and said second test loads comprise first and second capacitors respectively.

6. The memory device as specified in claim 5, further comprising a means for charging said first and said second capacitors to a cell plate potential.

7. The memory device as specified in claim 6, further comprising a potential generator having an output node and configured to generate said cell plate potential at said output node, said first capacitor electrically coupled between said output node and said first section and said second capacitor electrically coupled between said output node and said second section.

8. A monolithic memory device, comprising:
   a) a first storage cell configured to store electrical data having an electrical potential;
   b) a digit line in selective electrical communication with said storage cell, said digit line for accepting said data;
   c) a second storage cell configured to store a complement of said data stored in said first storage cell;
   d) a digit bar line in selective electrical communication with said second storage cell, said digit bar line configured to accept said complement of said data;
   e) a cell plate potential generator configured to generate a cell plate potential at an output;
   f) a first test equilibrate device actuated at a control input by an equilibrate signal; and
   g) a second test equilibrate device actuated at a control input by said equilibrate signal, said first and said second test equilibrate devices serially connected at a serial node to said output of said cell plate generator.

9. The memory device as specified in claim 8, wherein said first test equilibrate device is electrically interposed between said digit line and said serial node and wherein said second test equilibrate device is electrically interposed between said digit bar line and said serial node.

10. The monolithic memory device as specified in claim 8, wherein when said first and said second test equilibrate devices are actuated during a test mode said cell plate potential is coupled to said digit line and said digit bar line thereby altering an equilibrate potential of said digit and said digit bar line to equalize a change in potential on said digit and said digit bar lines and to reduce a first cell margin between a potential of said first storage cell and a potential of said digit line and a second cell margin between a potential of said second storage cell and a potential of said digit bar line.

11. A monolithic memory device operational in an operational mode and operational in a test mode, comprising:
   a) a first storage cell configured to store a data signal;
   b) a first digit line assembly configured for selective electrical communication with said first storage cell, said first digit line accepting said data; and
   c) a first test load configured for electrical communication with said digit line only during said test mode;
   d) a second storage cell configured to store a complement of said data signal;
   e) a second digit line assembly configured for selective electrical communication with said second storage cell, said second digit line accepting the complement of said data; and
   f) a second test load configured for electrical communication with said second digit line only during the test mode.

12. The memory device as specified in claim 11, wherein said first and second test loads are coupled to said first and second digit lines respectively during accessing without interrupting a current flow between said first digit line and a first output line and without interrupting a current flow between said digit bar line and a second output line.

13. The memory device as specified in claim 11, wherein said first test load decreases a first cell margin between said first storage cell and said first digit line and said second test load decreases a second cell margin between said second storage cell and said second digit line.

14. The memory device as specified in claim 11, further comprising:
   a) a first switching device interposed between said first test load and said digit line; and
   b) a second switching device interposed between said second test load and said second digit line;
   c) a logic control circuit configured to generate an active load signal during said test mode to actuate said first and said second switching devices, said actuated first switching device coupling said first test load to said digit line and said actuated second switching device coupling said second test load to said digit bar line.

15. The memory device as specified in claim 14, wherein said logic control circuit is configured to generate an inactive load signal to deactuate said first and second switching devices during said operational mode to isolate said first and second test loads from said digit line and said digit bar line, respectively, during said operational mode.

16. The memory device as specified in claim 11, further comprising a sensing means configured to sense and amplify a first cell margin between said first storage cell and said digit line and a second cell margin between said second storage cell and said digit bar line.

17. The memory device as specified in claim 11, wherein said first test load comprises a first capacitor and wherein said second test load comprises a second capacitor.

18. The memory device as specified in claim 17, further comprising a cell plate generator configured to charge said first and said second capacitors to a cell plate potential, an output of said cell plate generator interposed between said first and said second capacitors.

19. A monolithic memory device, comprising:
a) a first storage cell configured to store data;
b) a second storage cell configured to store a complement of the data;
c) a first digit line in selective electrical communication with said first storage cell, said first digit line accepting said data;
d) a second digit line in selective electrical communication with said second storage cell, said second digit line accepting said complement of said data, said first and said second digit lines held at a precharge equilibrate potential during a precharge cycle; and
e) a cell plate potential generator, having an output node coupled to said first and said second digit lines, said generator configured to generate a cell plate potential at said output node.

20. The memory device as specified in claim 19, wherein an alternate equilibrate potential is provided at said first and said second digit lines during a test mode in response to said cell plate potential, said alternate equilibrate potential decreasing a first cell margin between said first storage cell and said first digit line and a second cell margin between said second storage cell and said second digit line by altering said precharge equilibrate potential to equalize a change in potential on said first and said second digit lines during the test mode.

21. The memory device as specified in claim 19, further comprising:
a) a first test equilibrate device actuated at a control input by an equilibrate signal and in selective electrical communication with said first digit line; and
b) a second test equilibrate device actuated at a control input by said equilibrate signal and in selective electrical communication with said second digit line, said first and said second test equilibrate devices serially connected at said output node of said cell plate potential generator, said cell plate potential effecting a potential of said first and said second digit lines during said test mode when said first and said second test equilibrate devices are actuated by said equilibrate signal thereby driving said first and said second digit lines to a respective alternate equilibrate potential.

22. The memory device as specified in claim 19, further comprising a sensing means configured to sense and amplify a first cell margin and a second cell margin, said first cell margin equal to a difference in potential between a potential of said first storage cell and a potential of said first digit line, and said second cell margin equal to a difference in potential between a potential of said second storage cell and a potential of said second digit line, wherein said first and said second cell margins are decreased during said test mode.

23. A monolithic memory device, comprising:
a) a storage cell configured to store electrical data having an electrical potential;
b) a digit line having first and second opposed sections, said digit line in selective electrical communication with said storage cell, said digit line accepting said data;
c) a sensing means configured to sense a cell margin, said cell margin a difference in potential between the electrical potential of said data and a potential of said digit line, said sensing means electrically interposed between said first and said second opposed sections;
d) a first isolation device in said first section, an actuation of said first isolation device coupling a capacitance of said first section to said sensing means; and
e) a second isolation device in said second section, an actuation of said second isolation device coupling a capacitance of said second section to said sensing means.

24. The memory device as specified in claim 23, wherein said first and said second switching devices are actuated at a same time during a test mode to increase a total digit line capacitance thereby decreasing the cell margin.

25. The memory device as specified in claim 23, further comprising a dummy load in electrical communication with said first section during the test mode, said dummy load further increasing the total digit line capacitance during the test mode.

26. The memory device as specified in claim 23, wherein said dummy load is a cell fabricated substantially the same as the storage cell.

27. The memory device as specified in claim 23, further comprising an accessing means configured to access the dummy load only during the test mode.

28. A method of performing a circuit test on a memory device having a storage capacitor, in selective electrical communication with a digit line, configured to store electrical data having an electrical potential, comprising the following steps:
a) accessing a dummy load only during the circuit test; and
b) electrically coupling a first section of the digit line to a second section of the digit line during the circuit test.

29. The method as specified in claim 28, further comprising the step of fabricating the dummy load and the storage capacitor to have substantially the same physical characteristics.

* * * * *